(12) United States Patent
Terai (10) Patent No.: US 9,208,868 B2
(45) Date of Patent: Dec. 8, 2015

(54) SEMICONDUCTOR DEVICE INCLUDING A VARIABLE RESISTANCE DEVICE, AND METHOD OF CONTROLLING THE SEMICONDUCTOR DEVICE

(71) Applicant: Renesas Electronics Corporation, Kawasaki-shi (JP)

(72) Inventor: Masayuki Terai, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/188,438

(22) Filed: Feb. 24, 2014

(65) Prior Publication Data
US 2014/0241038 A1 Aug. 28, 2014

(30) Foreign Application Priority Data

Feb. 25, 2013 (JP) ................................. 2013-034839

(51) Int. Cl.
| | |
|---|---|
| *G11C 11/00* | (2006.01) |
| *G11C 13/00* | (2006.01) |
| *H01L 45/00* | (2006.01) |
| *H01L 27/24* | (2006.01) |

(52) U.S. Cl.
CPC ........ *G11C 13/0007* (2013.01); *G11C 13/0069* (2013.01); *H01L 27/2436* (2013.01); *H01L 45/08* (2013.01); *H01L 45/1233* (2013.01); *H01L 45/146* (2013.01); *H01L 45/1675* (2013.01); *G11C 2213/15* (2013.01); *G11C 2213/79* (2013.01)

(58) Field of Classification Search
USPC ......................................................... 365/148
See application file for complete search history.

(56) References Cited

U.S. PATENT DOCUMENTS

| | | | | |
|---|---|---|---|---|
| 2010/0237317 | A1* | 9/2010 | Tsunoda ........................... | 257/4 |
| 2011/0216577 | A1* | 9/2011 | Tomotani et al. ............. | 365/148 |
| 2012/0069633 | A1* | 3/2012 | Katoh ............................ | 365/148 |
| 2012/0195100 | A1 | 8/2012 | Saitoh et al. | |
| 2012/0280713 | A1* | 11/2012 | Katoh ............................ | 326/46 |

FOREIGN PATENT DOCUMENTS

JP 2013-12285 A 1/2013

OTHER PUBLICATIONS

M. Terai et al "High Thermal Robust ReRam with a New Method for Suppressing Read Disturb" 2011 Symposium on VLSI Technology Digest of Technical Papers, pp. 50-51.

\* cited by examiner

*Primary Examiner* — Hoai V Ho
(74) *Attorney, Agent, or Firm* — McGinn IP Law Group, PLLC (57) ABSTRACT

A memory cell is included which has a selection transistor and a variable resistance device connected to a bit line through the selection transistor. The variable resistance device includes a first electrode which has a first metal material and is connected to the selection transistor, a second electrode which has a second metal material different from the first metal material, and an insulating film which is provided between the first electrode and the second electrode, has a third metal material different from the first metal material and the second metal material, and has oxygen. The second metal material has a greater normalized oxide formation energy than the first metal material.

15 Claims, 9 Drawing Sheets

EXPERIMENTAL EXAMPLE

FIG. 5B

COMPARATIVE EXAMPLE

SEMICONDUCTOR DEVICE INCLUDING A VARIABLE RESISTANCE DEVICE, AND METHOD OF CONTROLLING THE SEMICONDUCTOR DEVICE

This application is based on Japanese patent application No. 2013-034839, the content of which is incorporated hereinto by reference.

BACKGROUND

1. Technical Field

The invention relates to a semiconductor device and a method of controlling a semiconductor device, and is a technology which is applicable to, for example, a semiconductor device including a variable resistance device and a method of controlling the semiconductor device.

2. Related Art

As a type of non-volatile memory, there is a variable resistance storage device (Resistance Random Access Memory (ReRAM)) which uses a change in the resistance value of an insulating film provided between electrodes by applying a voltage thereto. A technology related to the ReRAM includes, for example, those described in Japanese Unexamined Patent Publication NO. 2013-012285 and 2011 Symposium on VLSI Technology Digest of Technical Papers p 50.

In Japanese Unexamined Patent Publication NO. 2013-012285 and 2011 Symposium on VLSI Technology Digest of Technical Papers p 50, a variable resistance device is described, which configure an upper electrode and a lower electrode using different materials. More specifically, it is described to apply a positive voltage to the upper electrode with a low normalized oxide formation energy at the time of a writing operation, and to apply the positive voltage to the lower electrode with a high normalized oxide formation energy at the time of a reading operation. That is, in Japanese Unexamined Patent Publication No. 2013-012285 and 2011 Symposium on VLSI Technology Digest of Technical Papers p 50, a variable resistance device of a unipolar type is proposed.

SUMMARY

A variable resistance device is switched between ON and OFF states by changing the resistance value of an insulating film provided between electrodes. In addition, at the time of a reading operation, the determination of whether the variable resistance device is in an ON state or an OFF state is performed by reading the resistance state of the insulating film. However, there has been a case where a variation occurs in the resistance value of the insulating film in an ON state. In this case, there is a risk of generating a reading failure.

Other objects and new features thereof will be apparent from the description of the specification and accompanying drawings.

In one embodiment, there is provided variable resistance device in which a second metal material included in a second electrode has a greater normalized oxide formation energy than a first metal material included in a first electrode connected to a selection transistor.

According to the embodiment, it is possible to prevent a reading failure in the variable resistance device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment will be described using drawings. Moreover, like reference numerals and signs refer to like elements in all the drawings, and thus appropriately the description will not be repeated.

Figure 1:
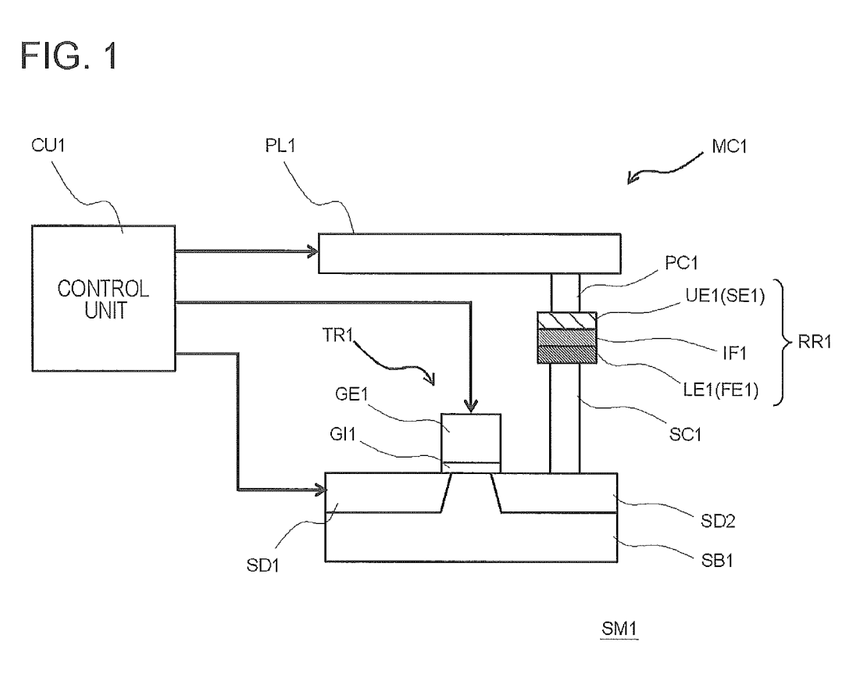
FIG. 1 is a cross-sectional diagram showing a semiconductor device according to the embodiment.
Figure 2:
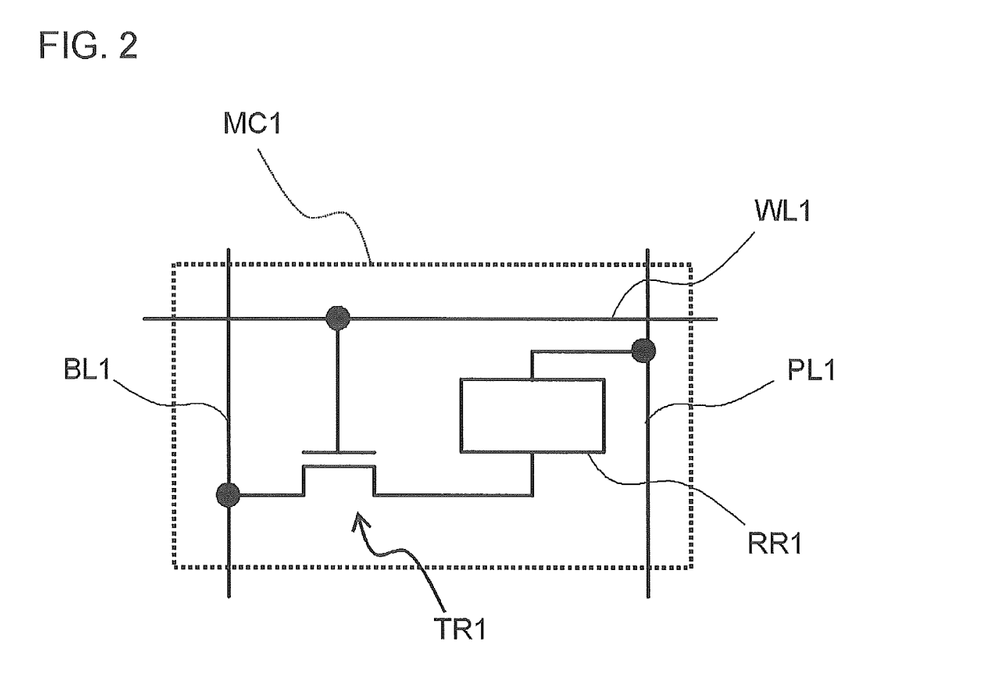
FIG. 2 is a circuit diagram showing the semiconductor device shown in FIG. 1.

FIG. 1 is a cross-sectional diagram showing a semiconductor device SM1 according to the embodiment. FIG. 2 is a circuit diagram showing the semiconductor device SM1 shown in FIG. 1.

The semiconductor device SM1 according to the embodiment includes a memory cell MC1 which has a selection transistor TR1 and a variable resistance device RR1 connected to a bit line BL1 through the selection transistor TR1. The variable resistance device RR1 includes a first electrode FE1, a second electrode SE1, and an insulating film IF1. The first electrode FE1 has a first metal material and is connected to the selection transistor TR1. The second electrode SE1 has a second metal material which is different from the first metal material. The insulating film IF1 is provided between the first electrode FE1 and the second electrode SE1, and has a third metal material, which is different from the first metal material and the second metal material, and has oxygen. The second metal material has a greater normalized oxide formation energy than the first metal material.

The inventor has found that the insulating film of a portion of the variable resistance devices transit to a high resistance state after switching from an OFF state to an ON state, and thereby a variation occurs in the resistance value of the insulating film in an ON state. The embodiment is devised based on this finding.

According to the embodiment, the second metal material included in the second electrode SE1 has a greater normalized oxide formation energy than the first metal material included in the first electrode FE1 connected to the selection transistor TR1. In this case, even if a positive voltage is applied to the second electrode SE1, the resistance state of the insulating film does not transit to the high resistance state. Therefore, the switching from an OFF state to an ON state is performed by applying a positive voltage to the second electrode SE1, and thereby it is possible to prevent the insulating film IF1 of the variable resistance device RR1 from transiting to the high resistance state after the switching from an OFF state to an ON state. Accordingly, it is possible to suppress the variation in the resistance value of the insulating film of the variable resistance device, and to prevent a reading failure from occurring.

Hereinafter, a configuration of the semiconductor device SM1 according to the embodiment and a method of manufacturing the semiconductor device SM1 will be described in detail.

First, the configuration of the semiconductor device SM1 according to the embodiment will be described.

The semiconductor device SM1 includes the memory cell MC1. For example, the semiconductor device SM1 includes a plurality of memory cells MC1 arranged in an array shape. The memory cell MC1 configures a non-volatile memory. The memory cell MC1 has, for example, the selection transistor TR1 and the variable resistance device RR1. In this case, the memory cell MC1 configures a one-transistor and one-resistor (1T1R) type of non-volatile memory.

In the embodiment, the memory cell MC1 has the selection transistor TR1 and the variable resistance device RR1. The variable resistance device RR1 is connected to the bit line BL1 through the selection transistor TR1. In an example shown in FIG. 1, both the variable resistance device RR1 and the selection transistor TR1 are formed on a substrate SB1.

The selection transistor TR1 has source/drain regions SD1 and SD2 formed on the substrate SB1, a gate insulating film GI1 provided on the substrate SB1, and a gate electrode GE1 provided on the gate insulating film GI1.

The selection transistor TR1 is a Field Effect Transistor (FET) manufactured using a normal silicon process. In this case, as a component of the selection transistor TR1, it is possible to use, for example, Metal/High-k gate and Silicon On Insulator (SOI). In addition, as the selection transistor TR1, a Fin Field Effect Transistor (FinFET) (transistor with a three-dimensional structure), a transistor in the interconnect and the like may be appropriately used. In addition, in order to supply enough current to cause switching to high resistance, an ON current of the selection transistor TR1 is equal to or more than 10 μA, and is more preferably equal to or more than 500 μA.

The variable resistance device RR1 has the first electrode FE1, the second electrode SE1, and the insulating film IF1 provided between the first electrode FE1 and the second electrode SE1. The variable resistance device RR1 is the ReRAM, and stores data by switching between ON and OFF states. In the embodiment, switching between ON and OFF states is performed by changing the resistance value of the insulating film IF1. Here, a case where the resistance state of the insulating film IF1 is a high resistance state is referred to as an OFF state, and a case where the resistance state of the insulating film IF1 is a low resistance state is referred to as an ON state.

In addition, the variable resistance device RR1 is, for example, ReRAM of a bipolar type. In this case, switching from an OFF state to an ON state is performed by applying a positive voltage to one of the first electrode FE1 and the second electrode SE1, and switching from an ON state to an OFF state is performed by applying the positive voltage to the other of the first electrode FE1 and the second electrode SE1.

The first electrode FE1 of the variable resistance device RR1 is electrically connected to the selection transistor TR1, and thereby the variable resistance device RR1 is electrically connected to the selection transistor TR1. In the embodiment, the first electrode FE1 is connected to a source/drain region SD2 of the selection transistor TR1. At this time, the first electrode FE1 is connected to the source/drain region SD2 without going through the insulating film IF1 and the second electrode SE1.

In addition, the second electrode SE1 of the variable resistance device RR1 is not grounded. That is, the semiconductor device SM1 is configured so that a voltage can be applied to the second electrode SE1.

In FIG. 1, an example that the first electrode FE1 is a lower electrode LE1 of the variable resistance device RR1 is shown. In this case, the first electrode FE1 which is the lower electrode LE1 is connected to the source/drain region SD2 of the selection transistor TR1 through, for example, a source/drain contact SC1. Accordingly, the lower electrode LE1 can be formed using an existing process.

In addition, in the example shown in FIG. 1, the second electrode SE1 is an upper electrode UE1 of the variable resistance device RR1. In this case, the lower electrode LE1 which is the first electrode FE1, the insulating film IF1, and the upper electrode UE1 which is the second electrode SE1 are sequentially stacked. In addition, the second electrode SE1 which is the upper electrode UE1 is connected to, for example, a plate line PL1 to be described through a plate contact PC1 which is provided on the upper electrode UE1.

In the variable resistance device RR1 according to the embodiment, the first electrode FE1 may be the upper electrode UE1, and the second electrode SE1 may be the lower electrode LE1. In this case, the upper electrode UE1 is connected to the source/drain region SD2 of the selection transistor TR1 without going through the insulating film IF1 and the lower electrode LE1. In addition, the lower electrode LE1 is connected to the plate line PL1 without going through the insulating film IF1 and the upper electrode UE1.

As shown in FIG. 2, the semiconductor device SM1 includes the plate line PL1, a bit line BL1, and a word line WL1. In the embodiment, the plate line PL1, the bit line BL1, and the word line WL1 are connected to the memory cell MC1, respectively.

The plate line PL1 is connected to the second electrode SE1 of the variable resistance device RR1. That is, a voltage is applied to the second electrode SE1 through the plate line PL1. In the example shown in FIG. 1, the plate line PL1 is connected to the upper electrode UE1 which is the second electrode SE1 through the plate contact PC1 provided on the upper electrode UE1.

The bit line BL1 is connected to the source/drain region SD1 of the selection transistor TR1. Therefore, the bit line BL1 is connected to the first electrode FE1 of the variable resistance device RR1 through the selection transistor TR1. That is, a voltage is applied to the first electrode FE1 through the bit line BL1 and the selection transistor TR1. In the example shown in FIG. 1, the bit line BL1 is connected to the lower electrode LE1 which is the first electrode FE1 of the variable resistance device RR1 through the selection transistor TR1.

The word line WL1 is connected to the gate electrode GE1 of the selection transistor TR1. Therefore, a voltage is applied to the gate electrode GE1 through the word line WL1.

The first electrode FE1 includes the first metal material. The second electrode SE1 includes the second metal material which is different from the first metal material. The second metal material has a greater normalized oxide formation energy than the first metal material. The normalized oxide formation energy refers to a value which is obtained by normalizing oxide formation enthalpy, which is a physical quantity corresponding to the energy generated during the oxidation of any material, per oxygen atom of a produced metal oxide. As a material has a greater normalized oxide formation energy, oxygen atoms are more likely to combine with a metal of the material, that is, the material is more easy to be oxidized. As a material has a smaller normalized oxide formation energy, the material is more difficult to be oxidized.

Here, the operation principle of the semiconductor device SM1 will be described. In the variable resistance device RR1 which is the ReRAM, a leak path formation processing referred to as a forming is first performed after manufacturing a device. This processing is considered to cause oxygen vacancy and a defect level in the insulating film IF1 by applying a voltage between the first electrode FE1 and the second electrode SE1 to form the leak path in the insulating film IF1. Then, it is thought that the resistance value of the insulating film IF1 is changed, caused by the connection or the disconnection of the leak path. A portion of the leak path is disconnected in a high resistance state, but the oxygen vacancy and the defect level caused thereby occur in the disconnected portion of the leak path by applying a voltage to the insulating film IF1 and the leak path is connected, and thereby low resistance is caused. On the other hand, when a current flows in the connected leak path, it is considered that the vicinity thereof, particularly the vicinity of an electrode on a side with high potential, is locally heated and oxygen atoms in the insulating film IF1 are thermally activated to be moved to a more stable position, thereby eliminating the oxygen vacancy. Accordingly, it is considered that the leak path is disconnected to cause a high resistance.

According to the embodiment, the second metal material included in the second electrode SE1 has a greater normalized oxide formation energy than the first metal material included in the first electrode FE1 connected to the selection transistor TR1. That is, the second electrode SE1 is configured to have a metal material which is unlikely to be oxidized compared to the first electrode FE1. The inventor has found that when applying a positive voltage to the second electrode SE1 in the configuration, the resistance state of the insulating film IF1 does not transit from a low resistance state to a high resistance state. It is considered that this is because oxygen atoms for eliminating the oxygen vacancy which configure the leak path, reacts with the second electrode SE1 which is easy to be oxidized. That is, it is estimated that even if the oxygen atoms in the insulating film IF1 are thermally activated, the oxygen atoms combines with the metal atoms of the second electrode SE1 to be oxidized and stabilized, so that the elimination of the oxygen vacancy is interrupted.

In this manner, according to the embodiment, even if a positive voltage is applied to the second electrode SE1, the resistance state of the insulating film does not transit to a high resistance state. Therefore, switching from an OFF state to an ON state is performed by applying the positive voltage to the second electrode SE1, and thereby it is possible to prevent the insulating film IF1 of the variable resistance device RR1 from transiting to the high resistance state after the switching from the OFF state to the ON state. Accordingly, it is possible to suppress a variation in the resistance value of the insulating film of the variable resistance device, and to prevent the reading failure from occurring.

In addition, when applying a positive voltage to the first electrode FE1, it is possible to cause the resistance state of the insulating film IF1 to transit from a low resistance state to a high resistance state. It is considered that this is because the first electrode FE1 is configured to have a metal material which is unlikely to be oxidized. That is, it is estimated that this is because oxygen atoms in the insulating film IF1, which are thermally activated, can eliminate the oxygen vacancy configuring the leak path without combining with metal atoms of the second electrode SE1.

In this manner, according to the embodiment, a positive voltage is applied to the first electrode FE1, and thereby it is possible to cause the resistance state of the insulating film IF1 to transit to a high resistance state, and to perform the switching from an ON state to an OFF state. Therefore, it is possible to realize a function as a ReRAM while preventing the reading failure from occurring.

Furthermore, the selection transistor TR1 of the memory cell MC1 is connected to the first electrode FE1 of the variable resistance device RR1. Therefore, a voltage can be stably supplied to the second electrode SE1 without being affected the variation of the threshold voltage of the selection transistor TR1. Therefore, the transition to a low resistance state of the insulating film IF1 can be more controlled.

Figure 3:
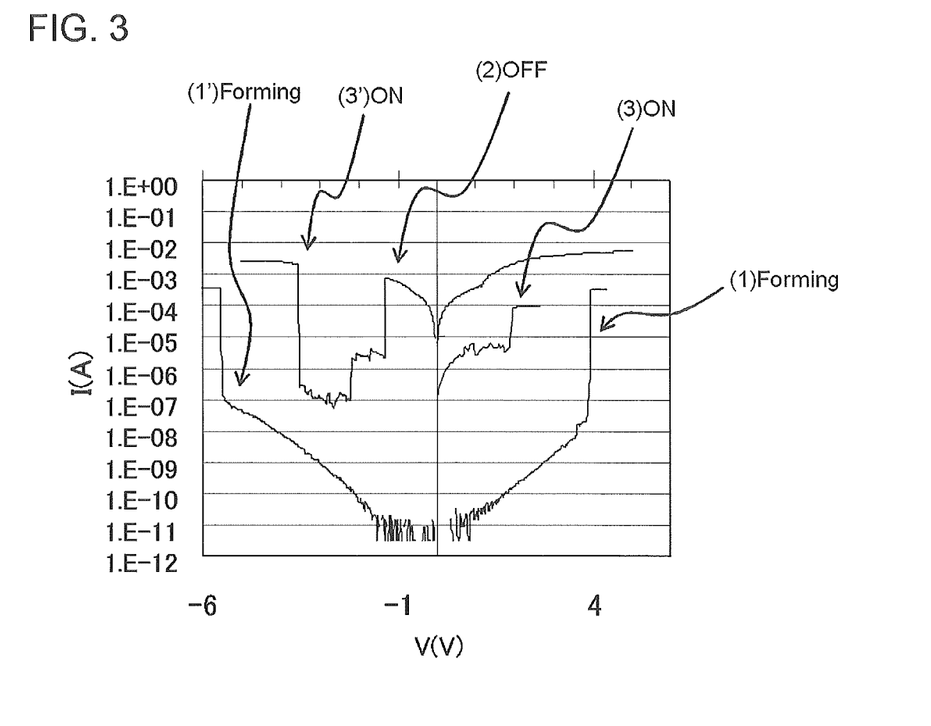
FIG. 3 is a graph showing an operational behavior of the semiconductor device shown in FIG. 1.

FIG. 3 is a graph showing an operational behavior of the semiconductor device SM1 shown in FIG. 1. FIG. 3 shows a relationship between a voltage value applied to the second electrode SE1 and a current value flowing in the variable resistance device RR1. As shown in FIG. 3, in the variable resistance device RR1 which is the ReRAM, forming processing is first performed which forms a leak path in the insulating film IF1 by applying a voltage between the first electrode FE1 and the second electrode SE1. Thereafter, the resistance state of the insulating film IF1 is changed by controlling the voltage applied between the first electrode FE1 and the second electrode SE1.

In the example shown in FIG. 3, when applying a negative voltage to the second electrode SE1, that is, when applying a positive voltage to the first electrode FE1, a forming (forming (1')), a transition from an ON state to an OFF state (OFF (2)), and a transition from an OFF state to an ON state (ON (3)) occur. Therefore, a positive voltage is applied to the first electrode FE1, and thereby it is possible to increase the resistance value of the insulating film IF1 and to cause the transition from an ON state to an OFF state.

On the other hand, when applying a positive voltage to the second electrode SE1, the resistance state of the insulating film IF1 does not transit from a low resistance state to a high resistance state. That is, even if the positive voltage is applied to the second electrode SE1, the transition from an ON state to an OFF state does not occur. Therefore, when applying the positive voltage to the second electrode SE1, a transition from a high resistance state to a low resistance state, that is, a forming (Forming (1)) and the transition from an OFF state to an ON state (ON (3)), only occurs.

In the embodiment, the first metal material configuring the first electrode FE1 is, for example, Ru, $RuO_2$, Pt, Ir, Rh, Pd, or Cu, or an alloy including two or more of these. In addition, the second metal material configuring the second electrode SE1 is, for example, W, Al, TiN, Ti, Ta, TaN, Hf, HfN, Zr, or ZrN, or an alloy including two or more of these. Accordingly, it is possible to make a desired relationship of normalized oxide formation energy between the first metal material configuring the first electrode FE1 and the second metal material configuring the second electrode SE1 while using an existing process.

The insulating film IF1 includes a third metal material which is different from the first metal material and the second metal material, and includes oxygen. At this time, the first electrode FE1, the second electrode SE1, and the insulating film IF1 include different metal materials, respectively.

Here, the normalized oxide formation energies of the first metal material, the second metal material, and the third metal material are, respectively, defined as $\Delta H_{f1}$, $\Delta H_{f2}$, and $\Delta H_{f3}$. As a result of performing an inspection using various types of insulating film materials and electrode materials, it is found that a preferable range of $\Delta H_{f1}$ and $\Delta H_{f2}$ depends on the normalized oxide formation energy $\Delta H_{f3}$ of a metal element configuring the insulating film IF1. It is considered that this is because a degree of stabilization caused by eliminating oxygen vacancy in the insulating film IF1 varies depending on the third metal material. From these findings, it is more preferable in the embodiment to satisfy a relationship of $\Delta H_{f2} \geq \Delta H_{f3}/7 + 220$ (kJ/mol) and $\Delta H_{f1} \leq \Delta H_{f3}/7 + 100$ (kJ/mol). Accordingly, it is possible to stably and remarkably obtain the effect of realizing the ReRAM capable of preventing the reading failure from occurring.

The insulating film IF1 is configured, for example, to have $Ta_2O_5$, a stacked film of $Ta_2O_5$ and $TiO_2$, $ZrO_2$, a stacked film of $ZrO_2$ and $Ta_2O_5$, NiO, $SrTiO_3$, $SrRuO_3$, $Al_2O_3$, $La_2O_3$, $HfO_2$, $Y_2O_3$ or $V_2O_5$. Accordingly, it is possible to make a desired relationship of normalized oxide formation energies among the first metal material, the second metal material, and the third metal material while using an existing process.

When the lower electrode LE1 is configured to have $Ta_2O_5$, it is preferable to satisfy a relationship of $\Delta H_{f1} < 150$ (kJ/mol) and $\Delta H_{f2} > 280$ (kJ/mol). Accordingly, it is possible to more reliably prevent the insulating film IF1 from transiting to a high resistance state when applying a positive voltage to the second electrode SE1. In addition, it is possible to cause a transition to a high resistance state to reliably occur when applying a positive voltage to the first electrode FE1. Therefore, it is possible to more remarkably obtain the effect of realizing the ReRAM capable of preventing the reading failure from occurring.

The semiconductor device SM1 includes, for example, the control unit CU1. The control unit CU1 controls a voltage applied to the memory cell MC1. The control unit CU1 is electrically connected to, for example, the first electrode FE1, the second electrode SE1, and the gate electrode GE1, and controls the voltage applied to these, respectively. In the example shown in FIG. 1, the control unit CU1 is electrically connected to the upper electrode UE1 which is the second electrode SE1 through a plate line PL1 and a plate contact PC1. In addition, the control unit CU1 is electrically connected to the source/drain region SD1, thereby being electrically connected to the lower electrode LE1 which is the first electrode FE1 through the selection transistor TR1 and the source/drain contact SC1.

The control unit CU1 applies a positive voltage to the first electrode FE1 connected to the selection transistor TR1 at the time of an operation of increasing the resistance value of the insulating film IF1. That is, when the variable resistance device RR1 is switched from an ON state to an OFF state, a positive voltage is applied to the first electrode FE1. On the other hand, the control unit CU1 applies a positive voltage to the second electrode SE1 at the time of an operation of decreasing the resistance value of the insulating film IF1. That is, when the variable resistance device RR1 is switched from an OFF state to an ON state, a positive voltage is applied to the second electrode SE1. In the embodiment, as a method of controlling the semiconductor device SM1, it is possible to adopt such control.

A voltage applied to the memory cell MC1 is controlled in this manner, and thereby it is possible to operate the variable resistance device RR1 as a ReRAM. In addition, at the time of the switching from an OFF state to an ON state, it is possible to suppress a variation in the resistance value of the insulating film of the variable resistance device and to prevent the reading failure from occurring.

Moreover, the control unit CU1, for example, applies a positive voltage to the second electrode SE1 at the time of an operation of reading the resistance value of the insulating film IF1. As described above, when applying a positive voltage to the second electrode SE1, the transition from an ON state to an OFF state does not occur. Therefore, at the time of a reading operation, it is possible to prevent the resistance state of the insulating film IF1 from transiting to a high resistance state.

In addition, the control unit CU1 applies a positive voltage to, for example, the second electrode SE1 when performing a forming operation. The variable resistance device RR1 after the forming operation is in an ON state in which the insulating film IF1 has a low resistance value.

Since the leak path is formed in the insulating film IF1 at the time of the forming operation, it is necessary to apply a high voltage to the variable resistance device RR1. However, when applying a positive voltage to the first electrode FE1, a voltage value which can be applied to the variable resistance device RR1 is limited by a gate voltage of the selection transistor TR1. In this case, it is not possible to apply an enough voltage for the forming operation to the variable resistance device RR1, so that the forming operation is hardly performed. On the other hand, when a positive voltage is applied to the second electrode SE1, it can be avoided that the voltage value applied to the variable resistance device RR1 is limited by the gate voltage. Therefore, in order to stably perform the forming operation, it is preferable to apply a voltage to the second electrode SE1 at the time of the forming operation.

In addition, the inventor has found that the insulating film of a portion of the variable resistance devices RR1 transits to a high resistance state after the forming operation, and thereby there occurs a variation in the resistance value of the insulating film in an ON state after the forming operation.

According to the embodiment, even at the time of performing the forming operation, a positive voltage is applied to the second electrode SE1. Therefore, it is possible to stably perform the forming operation. Moreover, it is possible to prevent the variable resistance device RR1 from transiting to a high resistance state after the forming operation, and to suppress the variation in the resistance value of the insulating film of the variable resistance device RR1 in an ON state. Accordingly, the reading operation failure of the variable resistance device RR1 can be prevented.

Therefore, it is possible to stably perform the operation of the variable resistance device RR1.

Figure 4:
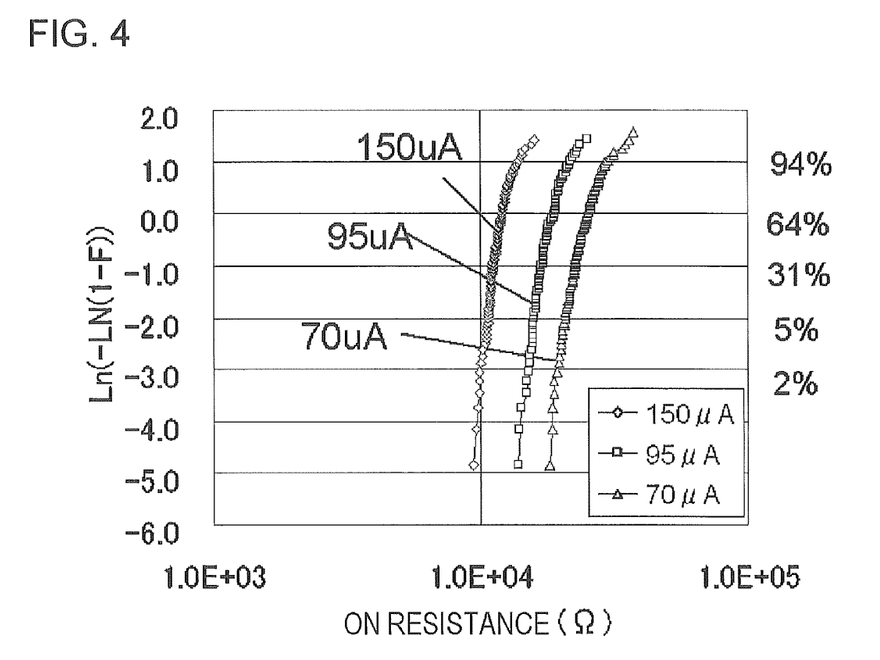
FIG. 4 is a graph showing the distribution of the resistance value of variable resistance devices in an ON state.

FIG. 4 is a graph showing the distribution of resistance values of the variable resistance devices RR1 in an ON state. In FIG. 4, by changing a current value providing a transition to an ON state (hereinafter, referred to as an ON switching current value), the distribution of resistance values in an ON state obtained for each ON switching current value is shown. Here, Ru as the first electrode FE1, W as the second electrode SE1, and a stacked film as the insulating film IF1 made by sequentially stacking $TiO_2$, $Ta_2O_5$, and $TiO_2$ are used, respectively. Moreover, the ON switching current value is controlled so as to be 70 μA, 95 μA, or 150 μA.

As shown in FIG. 4, in this experimental example, the variation in the resistance value of the variable resistance device RR1 after the transition to an ON state is suppressed, and thereby a uniform ON resistance distribution is obtained.

In addition, it is confirmed that the uniform ON resistance distribution is obtained even when changing the ON switching current value.

Figure 5A:
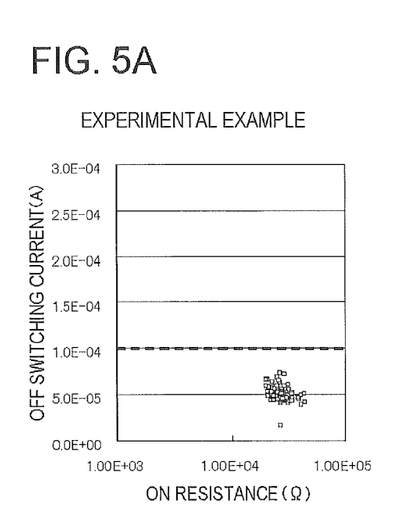
FIGS. 5A and 5B are graphs showing the relationship between the resistance value of the variable resistance devices in an ON state and a current value providing a transition to an OFF state.
Figure 5B:
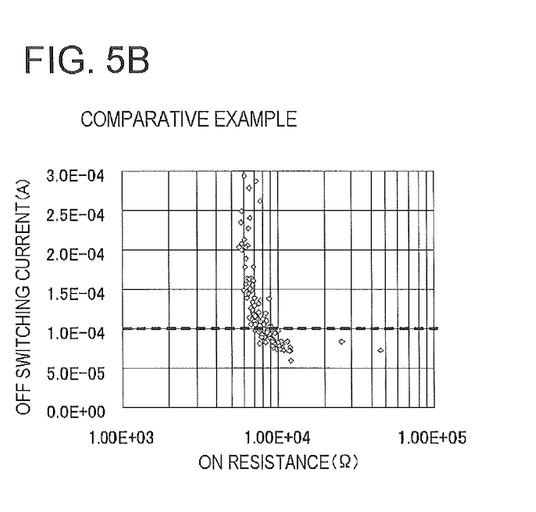

FIGS. 5A and 5B are graphs showing a relationship between the resistance value of the variable resistance devices RR1 in the ON state (hereinafter, referred to as an ON resistance value) and a current value (hereinafter, referred to as an OFF switching current) which provides a transition to an OFF state. As the variable resistance device RR1 according to the experimental example, the variable resistance devices RR1 having a structure in which the second electrode SE1 has a greater normalized oxide formation energy than the first electrode FE1 connected to the selection transistor TR1 are used. As the variable resistance device RR1 according to a comparative example, the variable resistance devices RR1 having a structure in which the second electrode SE1 has a smaller normalized oxide formation energy than the first electrode FE1 connected to the selection transistor TR1 are used. In any of the experimental example and the comparative example, the ON resistance value in the case of the transition to an ON state by applying a positive voltage to the second electrode SE1 is shown.

In the variable resistance device RR1, it is required to suppress an increase in an OFF switching current, which causes an increase in the area of the selection transistor TR1 and the peripheral circuit. However, the OFF switching current increases as the resistance value of the insulating film IF1 in an ON state gets lower.

As shown in FIGS. 5A and 5B, in the comparative example, there is a large variation in the ON resistance value of the variable resistance device RR1. Therefore, it is necessary to increase the OFF switching current so as to cause all the variable resistance devices RR1 to transit to an OFF state. On the other hand, in the experimental example, it is confirmed that it is possible to suppress the variation in the resistance value of the variable resistance device RR1, and to increase the resistance value of the variable resistance device RR1 in an ON state. Here, it is found that it is possible to cause all the variable resistance devices RR1 to transit to an OFF state using the OFF switching current of 100 μA or less. Therefore, it is possible to prevent the current value from increasing at the time of the transition to an OFF state, and to suppress an increase in the area of the selection transistor and the peripheral circuit. In addition, it is possible to realize a highly reliable OFF switching operation.

Figure 6A:
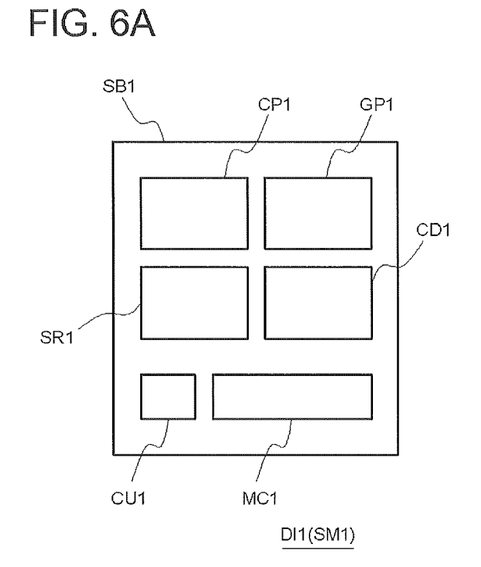
FIGS. 6A and 6B are schematic diagrams showing an example of a die including the semiconductor device according to the embodiment.
Figure 6B:
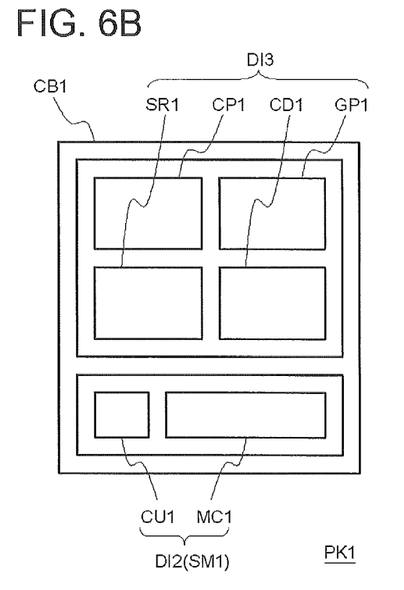

FIGS. 6A and 6B are schematic diagrams showing an example of a die including the semiconductor device SM1 according to the embodiment.

In FIG. 6A, it is illustrated that the semiconductor device SM1 is a System on Chip (SoC) die DI1 which includes the memory cell MC1, the control unit CU1, a CPU core CP1, a graphics core GP1, a codec core CD1, and a SRAM core SR1. In this case, the memory cell MC1, the control unit CU1, the CPU core CP1, the graphics core GP1, the codec core CD1, and the SRAM core SR1 are arranged on one substrate SB1, and configure a die DI1. In the die DI1, other circuits may be formed.

In FIG. 6B, the semiconductor device SM1 is a die DI2 which includes the memory cell MC1 and the control unit CU1. In addition, the CPU core CP1, the graphics core GP1, the codec core CD1, and the SRAM core SR1 are included in a SOC die DI3 which is different from the die DI2. These dies DI2 and DI3 are mounted on a circuit board CB1 to configure a semiconductor package PK1 (System in Package (SiP)). In the die DI3, other circuits may be formed.

Next, a method of manufacturing the semiconductor device SM1 according to the embodiment will be described.

FIGS. 7A, 7B, 7C, 8A, 8B, 9A and 9B are cross-sectional diagrams each showing a method of manufacturing the semiconductor device SM1 shown in FIG. 1.

Figure 7A:
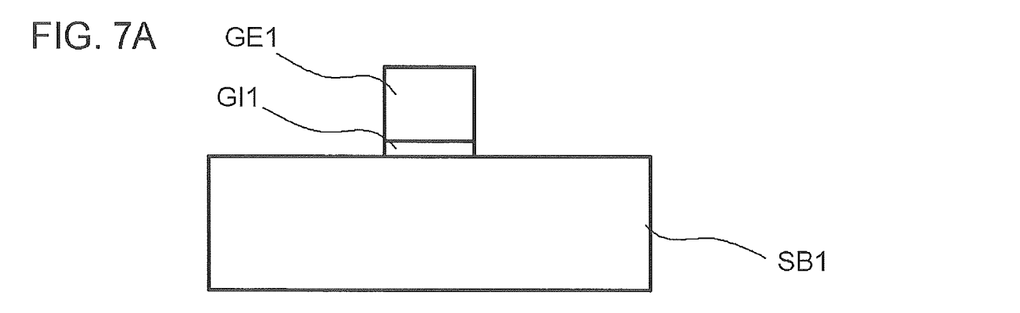
FIGS. 7A, 7B, and 7C are cross-sectional diagrams showing a method of manufacturing the semiconductor device shown in FIG. 1.

First, as shown in FIG. 7A, the gate insulating film GI1 and the gate electrode GE1 are formed on the substrate SB1. For example, the gate insulating film GI1 and the gate electrode GE1 are formed by sequentially stacking a silicon oxide film and a phosphorus-doped polysilicon film on the substrate SB1 and patterning the result using dry etching.

Figure 7B:
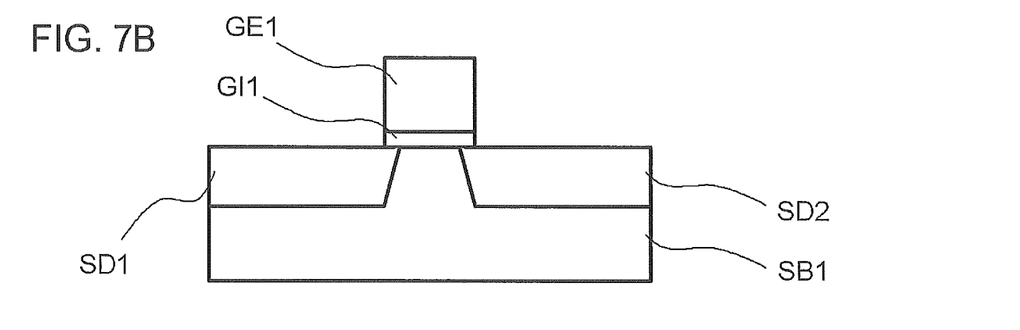
Figure 7C:
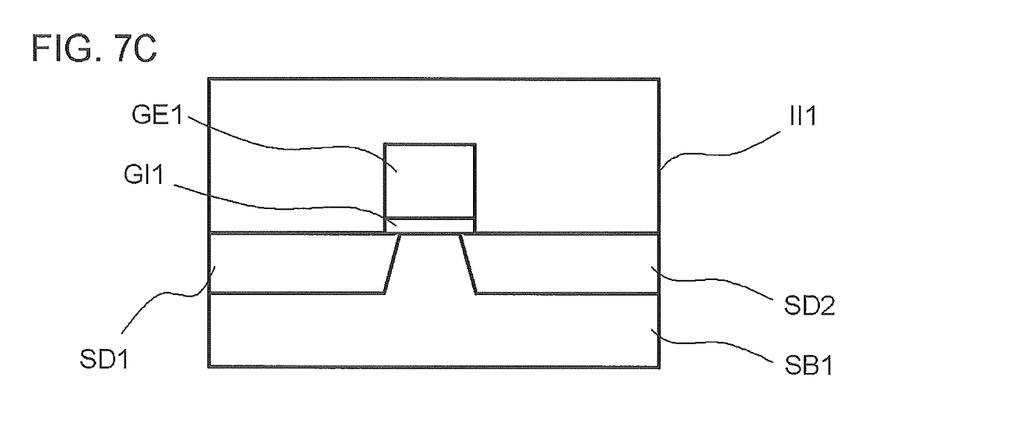

Next, as shown in FIG. 7B, the source/drain region SD1 and the source/drain region SD2 are formed on the substrate SB1. The source/drain region SD1 and the source/drain region SD2 are formed, for example, by performing a phosphorus implantation of a dose amount of 2E+15 $cm^{-2}$ using the gate electrode GE1 as a mask. Next, as shown in FIG. 7C, an interlayer insulating film II1 is deposited on the substrate SB1 and the gate electrode GE1, and is planarized by Chemical Mechanical Polishing (CMP) method. The interlayer insulating film II1 is configured to have an oxide film such as a silicon oxide film.

Figure 8A:
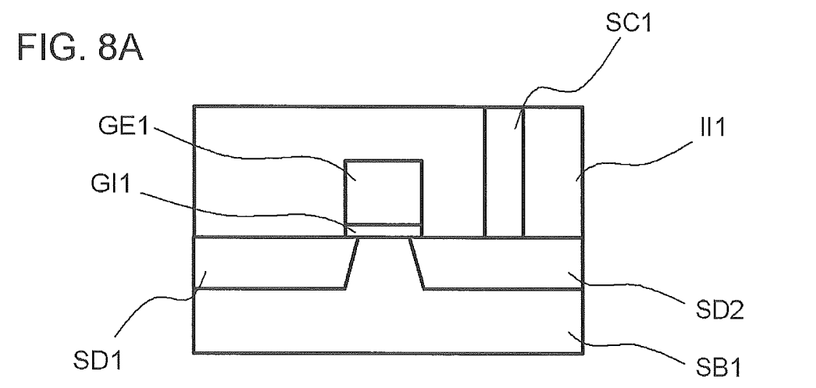
FIGS. 8A and 8B are cross-sectional diagrams showing the method of manufacturing the semiconductor device shown in FIG. 1.

Next, as shown in FIG. 8A, in the interlayer insulating film II1, the source/drain contact SC1 connected to the source/drain region SD2 is formed. The source/drain contact SC1 is formed, for example, in the following manner. First, a contact hole is opened in the interlayer insulating film II1 by dry etching. Next, TiN and W are deposited in the contact hole. Then, TiN and W deposited except in the contact hole are removed by the CMP method, and thereby the source/drain contact SC1 is formed.

Figure 8B:
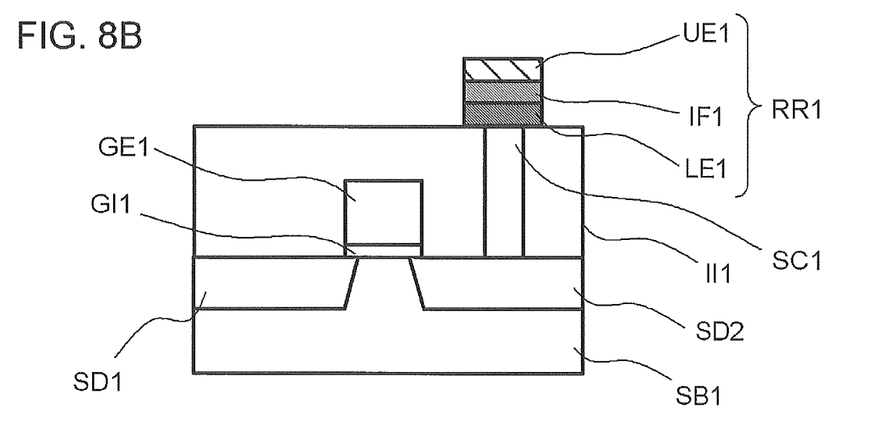

Next, as shown in FIG. 8B, the lower electrode LE1, the insulating film IF1, and the upper electrode UE1 are sequentially formed. At this time, the lower electrode LE1 is formed so as to be connected to the source/drain contact SC1. For example, the lower electrode LE1, the insulating film IF1, and the upper electrode UE1 are formed by performing an exposure process and a dry etching process on a stacked film where Ru of 10 nm, $TiO_2$ of 3 nm, $Ta_2O_5$ of 10 nm, and W of 10 nm are sequentially stacked on the interlayer insulating film II1 and the source/drain contact SC1. Accordingly, the variable resistance device RR1 is formed.

Figure 9A:
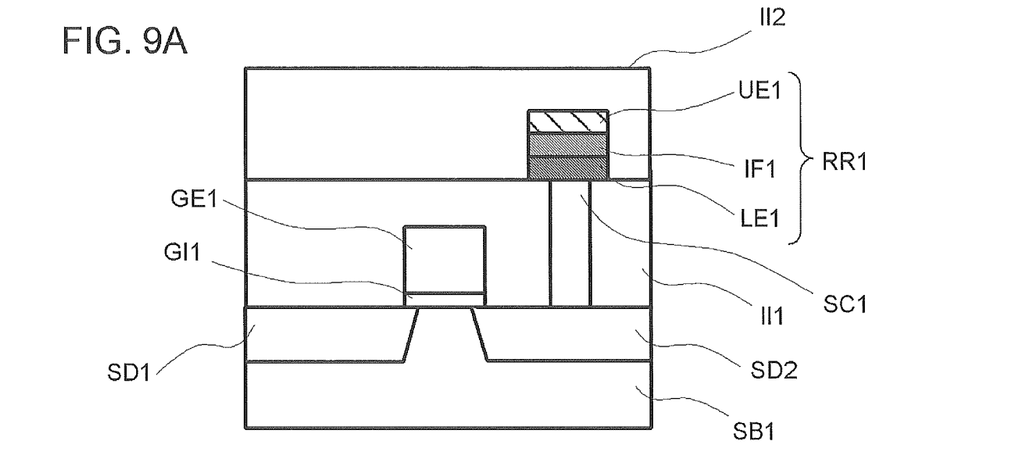
FIGS. 9A and 9B are cross-sectional diagrams showing the method of manufacturing the semiconductor device shown in FIG. 1.
Figure 9B:
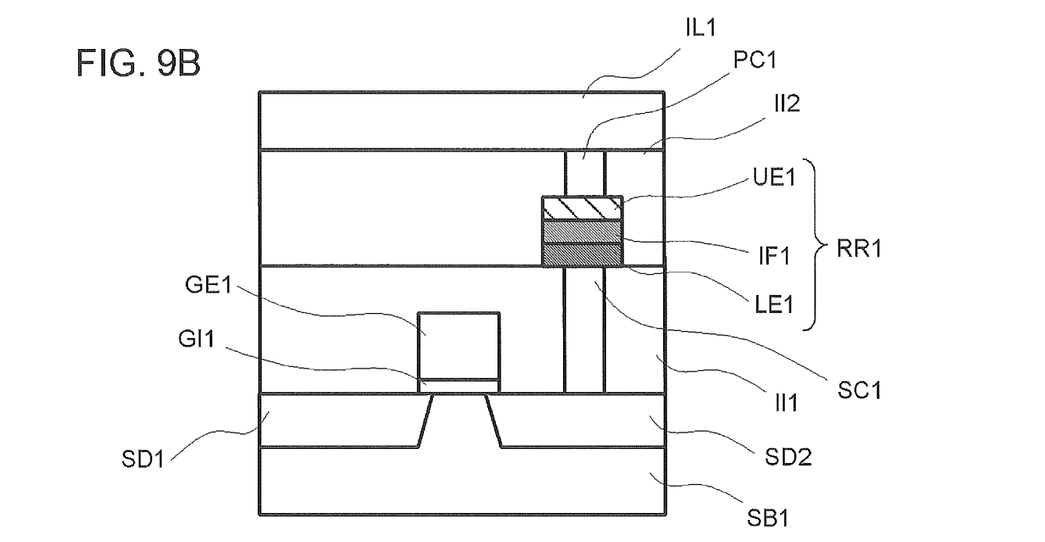

Next, as shown in FIG. 9A, on the interlayer insulating film II1 and the upper electrode UE1, the interlayer insulating film II2 is deposited and is planarized by the CMP method. The interlayer insulating film II2 is configured to have an oxide film such as a silicon oxide film. Next, as shown in FIG. 9B, a plate contact PC1 connected to the upper electrode UE1 is formed in the interlayer insulating film II2. The plate contact PC1 is formed, for example, in the following manner. First, a contact hole is opened in the interlayer insulating film II2 by dry etching. Next, TiN and W are deposited in the contact hole. Then, TiN and W deposited except in the contact hole are removed by the CMP method, and thereby the plate contact PC1 is formed.

Next, as shown in FIG. 9B, a interconnect layer 1L1 is formed on the interlayer insulating film II2 and the plate contact PC1. For example, the interconnect layer IL1 is formed by patterning TiN and Al sequentially deposited on the interlayer insulating film II2 and the plate contact PC1 using the exposure process and the dry etching process.

In the embodiment, the semiconductor device SM1 is formed, for example, in this manner.

Next, the effect of the embodiment will be described.

According to the embodiment, the second metal material included in the second electrode SE1 has a greater normalized oxide formation energy than the first metal material included in the first electrode FE1 connected to the selection transistor TR1. In this case, even if a positive voltage is applied to the second electrode SE1, the resistance state of the insulating film does not transit to a high resistance state. Therefore, by applying a positive voltage to the second electrode SE1 and performing switching from an OFF state to an ON state, it is possible to prevent the insulating film IF1 of the variable resistance device RR1 from transiting to the high resistance state after the switching from an OFF state to an ON state. Accordingly, it is possible to suppress the variation in the resistance value of the insulating film of the variable resistance device, and to prevent the reading failure from occurring.

The invention invented by the inventor is described in detail based on an embodiment. However, it is certain that the invention is not limited to the above embodiment, and various modifications may be possibly made in a scope without departing from the spirit of the invention.

It is apparent that the present invention is not limited to the above embodiment, and may be modified and changed without departing from the scope and spirit of the invention.

What is claimed is:

1. A semiconductor device comprising:
a memory cell which has a selection transistor and a variable resistance device connected to a bit line through the selection transistor; and
a control unit which controls a voltage applied to the memory cell,
wherein the control unit applies a positive voltage to the first electrode at the time of an operation of increasing the resistance value of the insulating film, and applies a positive voltage to the second electrode at the time of an operation of decreasing the resistance value of the insulating film,
wherein the variable resistance device includes
a first electrode which has a first metal material and is connected to the selection transistor;
a second electrode which has a second metal material different from the first metal material; and
an insulating film which is provided between the first electrode and the second electrode, has a third metal material different from the first metal material and the second metal material, and has oxygen, and
wherein a normalized oxide formation energy of the second metal material is greater than a normalized oxide formation energy of the first metal material.

2. The semiconductor device according to claim 1,
wherein, when defining the normalized oxide formation energy of the first metal material, the second metal material, and the third metal material as $\Delta H_{f1}$, $\Delta H_{f2}$, and $\Delta H_{f3}$, respectively, $\Delta H_{f2} \geq \Delta H_{f3}/7+220$ (kJ/mol) and $\Delta H_{f1} \leq \Delta H_{f3}/7+100$ (kJ/mol) are satisfied.

3. The semiconductor device according to claim 1,
wherein the insulating film is configured to have $Ta_2O_5$, and
when the normalized oxide formation energies of the first metal material and the second metal material are defined as $\Delta H_{f1}$ and $\Delta H_{f2}$, respectively, $\Delta H_{f1}<150$ (kJ/mol) and $\Delta H_{f2}>280$ (kJ/mol) are satisfied.

4. The semiconductor device according to claim 1,
wherein the second metal material is W, Al, TiN, Ti, Ta, TaN, Hf, HfN, Zr, or ZrN, or an alloy made from two or more of these.

5. The semiconductor device according to claim 1,
wherein the first metal material is Ru, $RuO_2$, Pt, Ir, Rh, Pd, or Cu, or an alloy made from two or more of these.

6. The semiconductor device according to claim 1,
wherein the insulating film is configured to have $Ta_2O_5$, a stacked film of $Ta_2O_5$ and $TiO_2$, $ZrO_2$, a stacked film of $ZrO_2$ and $Ta_2O_5$, NiO, $SrTiO_3$, $SrRuO_3$, $Al_2O_3$, $La_2O_3$, $HfO_2$, $Y_2O_3$ or $V_2O_5$.

7. The semiconductor device according to claim 1,
wherein the first electrode is connected to a source/drain region of the selection transistor through a contact.

8. The semiconductor device according to claim 1,
wherein the variable resistance device is of a bipolar type.

9. A method of controlling a semiconductor device which includes a first electrode having a first metal material, a second electrode having a second metal material different from the first metal material, and an insulating film which is provided between the first electrode and the second electrode, has a third metal material different from the first metal material and the second metal material, and has oxygen, and in which the second metal material has a greater normalized oxide formation energy than the first metal material, the method comprising:
applying a positive voltage to the first electrode at the time of an operation of increasing the resistance value of the insulating film; and
applying a positive voltage to the second electrode at the time of an operation of decreasing the resistance value of the insulating film.

10. The semiconductor device according to claim 1, further comprising:
a plate line;
a plate contact which connects the second electrode to the plate line, a voltage being applied to the second electrode through the plate line and the plate contact; and
an S/D contact which connects the first electrode to a source/drain region of the selection transistor.

11. The semiconductor device according to claim 1,
wherein the normalized oxide formation energy of the first metal material is less than 150 (kJ/mol).

12. The semiconductor device according to claim 1,
wherein the normalized oxide formation energy for the second metal material is greater than 280 (kJ/mol).

13. The semiconductor device according to claim 1,
wherein the first metal material comprises one member selected from the group consisting of Ru, $RuO_2$, Pt, Ir, Rh, Pd, Cu, and an alloy made from two or more of these,
wherein the second metal material comprises one member selected from the group consisting of W, Al, TiN, Ti, Ta, TaN, Hf, HfN, Zr, ZrN, and an alloy made from two or more of these, and
wherein the insulating film comprises one member selected from the group consisting of $Ta_2O_5$, a stacked film of $Ta_2O_5$ and $TiO_2$, $ZrO_2$, a stacked film of $ZrO_2$ and $Ta_2O_5$, NiO, $SrTiO_3$, $SrRuO_3$, $Al_2O_3$, $La_2O_3$, $HfO_2$, $Y_2O_3$ and $V_2O_5$.

14. A semiconductor device, comprising:
a memory cell, comprising:
a selection transistor; and
a variable resistance device connected to a bit line through the selection transistor, the variable resistance device comprising:
a first electrode which has a first metal material and is connected to the selection transistor, the first metal material having a normalized oxide formation energy less than 150 (kJ/mol), and comprising one member selected from the group consisting of Ru, $RuO_2$, Pt, Ir, Rh, Pd, Cu, and an alloy made from two or more of these;

a second electrode which has a second metal material different from the first metal material, the second metal material having a normalized oxide formation energy is greater than 280 (kJ/mol), and comprising one member selected from the group consisting of W, Al, TiN, Ti, Ta, TaN, Hf, HfN, Zr, ZrN, and an alloy made from two or more of these; and an insulating film which is provided between the first electrode and the second electrode, and comprises oxygen and a third metal material different from the first metal material and the second metal material, the insulating film comprising one member selected from the group consisting of $Ta_2O_5$, a stacked film of $Ta_2O_5$ and $TiO_2$, $ZrO_2$, a stacked film of $ZrO_2$ and $Ta_2O_5$, NiO, $SrTiO_3$, $SrRuO_3$, $Al_2O_3$, $La_2O_3$, $HfO_2$, $Y_2O_3$ and $V_2O_5$; and a control unit which controls a voltage applied to the memory cell, wherein the control unit applies a positive voltage to the first electrode at the time of an operation of increasing the resistance value of the insulating film, and applies a positive voltage to the second electrode at the time of an operation of decreasing the resistance value of the insulating film, and wherein a normalized oxide formation energy of the second metal material is greater than a normalized oxide formation energy of the first metal material.

15. The semiconductor device according to claim 14, wherein the following are satisfied: $\Delta H_{f2} \geq \Delta H_{f3}/7+220$ (kJ/mol) and $\Delta H_{f1} \leq \Delta H_{f3}/7+100$, where $\Delta Hf_1$, $\Delta Hf_2$, and $\Delta Hf_3$ represent the normalized oxide formation energy of the first metal material, the second metal material, and the third metal material, respectively.

* * * * *